(12) United States Patent
Vieux et al.

(10) Patent No.: US 8,257,996 B2
(45) Date of Patent: Sep. 4, 2012

(54) METHOD OF FABRICATING A RADIATION DETECTOR

(75) Inventors: Gérard Vieux, Froges (FR); Jean-Michel Vignolle, Moirans (FR); Pierre Rohr, Apprieu (FR); David Couder, Grenoble (FR); Dubois Sébastien, Ernolsheim (FR)

(73) Assignee: Trixell S.A.S. (FR)

( * ) Notice: Subject to any disclaimer, the term of this patent is extended or adjusted under 35 U.S.C. 154(b) by 233 days.

(21) Appl. No.: 12/600,908

(22) PCT Filed: May 22, 2008

(86) PCT No.: PCT/EP2008/056312
§ 371 (c)(1),
(2), (4) Date: Jul. 13, 2010

(87) PCT Pub. No.: WO2008/142135
PCT Pub. Date: Nov. 27, 2008

(65) Prior Publication Data
US 2010/0291726 A1 Nov. 18, 2010

(30) Foreign Application Priority Data
May 23, 2007 (FR) ...................................... 07 55204

(51) Int. Cl.
*H01L 31/18* (2006.01)
*H01L 31/115* (2006.01)
*H01L 27/146* (2006.01)
*G01T 1/20* (2006.01)
*G03B 42/02* (2006.01)

(52) U.S. Cl. ............... 438/69; 250/370.11; 250/370.09; 250/370.08; 250/371; 257/E31.092

(58) Field of Classification Search .................... 438/57, 438/69; 257/428, E31.092; 250/371, 370.11, 250/370.08, 370.09; 156/60
See application file for complete search history.

(56) References Cited

U.S. PATENT DOCUMENTS

| 5,990,505 A | 11/1999 | Kajiwara |
| 6,501,062 B2 * | 12/2002 | Tashiro ...................... 250/208.1 |

(Continued)

FOREIGN PATENT DOCUMENTS

| EP | 0 766 317 A2 | 4/1997 |

(Continued)

*Primary Examiner* — Mary Wilczewski
(74) *Attorney, Agent, or Firm* — Baker & Hostetler, LLP

(57) ABSTRACT

The present invention relates to a method of fabricating a radiation detector comprising a photosensitive sensor assembly (1, 4), a scintillator (6) that converts the radiation into radiation to which the photosensitive sensor assembly (1, 4) is sensitive, the scintillator (6) being fastened by adhesive bonding to the sensor assembly, the sensor assembly comprising a substrate (4) and several attached sensors (1), the sensors (1) each having two faces (11, 12), a first face (11) of which is bonded to the substrate (4) and a second face (12) of which is bonded to the scintillator (6). The method consists in linking the following operations:

the sensors (1) are deposited via their second face (12) on an adhesive film (13); and the sensors (1) are bonded via their first face (11) to the substrate (4).

12 Claims, 6 Drawing Sheets

U.S. PATENT DOCUMENTS

| | | | |
|---|---|---|---|
| 6,835,936 B2 * | 12/2004 | Okada et al. | 250/370.11 |
| 7,076,817 B1 * | 7/2006 | Garver | 5/424 |
| 7,105,830 B2 * | 9/2006 | Nagano et al. | 250/370.11 |
| 7,355,184 B2 * | 4/2008 | Nagano | 250/370.11 |
| 7,375,341 B1 * | 5/2008 | Nagarkar et al. | 250/370.11 |
| 7,402,814 B2 | 7/2008 | Vieux et al. | |
| 2005/0167604 A1 * | 8/2005 | Suganuma et al. | 250/370.11 |
| 2009/0026383 A1 * | 1/2009 | Kim et al. | 250/370.11 |
| 2010/0291726 A1 * | 11/2010 | Vieux et al. | 438/59 |
| 2011/0260066 A1 * | 10/2011 | Vieux | 250/361 R |

FOREIGN PATENT DOCUMENTS

| | | | |
|---|---|---|---|
| FR | 2 605 166 A1 | | 4/1988 |
| FR | 2 758 654 A1 | | 7/1998 |
| FR | 2 831 671 A1 | | 5/2003 |
| FR | 2 916 575 | * | 5/2007 |
| JP | 09-257943 A | | 10/1997 |
| JP | 2006-189377 | * | 7/2006 |
| JP | 2008-12885 | * | 6/2008 |

* cited by examiner

METHOD OF FABRICATING A RADIATION DETECTOR

CROSS-REFERENCE TO RELATED APPLICATIONS

This application is a national stage of International Application No. PCT/EP2008/056312, filed May 22, 2008, which claims priority to foreign French Application No. FR 07 55204, filed May 23, 2007, the disclosure of each application is hereby incorporated by reference in their entirety.

BACKGROUND OF THE INVENTION

The present invention relates to a method of fabricating a radiation detector comprising a photosensitive sensor associated with a radiation converter. The fields of application of this type of detector are notably the detection of X-rays used in radiology: radiography, fluoroscopy and mammography, and also for nondestructive testing. The invention will be described in relation to an X-ray detector. Of course, the invention may be implemented with any type of detector for which the photosensitive sensor is not directly sensitive to the radiation to be detected, and for which it is therefore necessary to interpose a radiation converter between an entry window of the detector and the photosensitive sensor.

Such radiation detectors are known for example from French patent FR 2 605 166, in which a sensor formed from amorphous silicon photodiodes is associated with a radiation converter.

The operation and the structure of such a radiation detector will now be briefly reviewed.

The photosensitive sensor is generally fabricated from solid-state photosensitive elements arranged in a matrix. The photosensitive elements are fabricated from semiconductor materials, usually single-crystal silicon in the case of CCD or CMOS sensors, polycrystalline silicon or amorphous silicon. A photosensitive element comprises at least one photodiode, at least one phototransistor or at least one photoresistor. These elements are deposited on a substrate, generally a glass plate.

In general, these elements are not directly sensitive to radiation of very short wavelength, such as X-rays or gamma rays. This is why the photosensitive sensor is associated with a radiation converter, which comprises a layer of a scintillating substance. This substance has the property, when it is excited by such radiation, of emitting radiation of longer wavelength, for example visible or near-visible light, to which the sensor is sensitive. The light emitted by the radiation converter illuminates the photosensitive elements of the sensor, which perform a photoelectric conversion and deliver electrical signals that can be exploited by appropriate circuits. The radiation converter will be called a scintillator in the rest of the description.

Certain scintillating substances of the family of alkali metal halides or rare-earth metal on/sulfides are frequently employed for their good performance.

Among alkali metal halides, cesium iodide doped with sodium or with thallium, depending on whether it is desired for the emission to be at around 400 nanometers or around 550 nanometers respectively, is known for its strong X-ray absorption and for its excellent fluorescence yield. It takes the form of fine needles which are grown on a support. These needles are approximately perpendicular to this support and they partly confine the light emitted toward the sensor. Their fineness determines the resolution of the detector. Lanthanum oxysulfide and gadolinium oxysulfide are also widely used for the same reasons.

However, some of these scintillating substances have the drawback of being not very stable—they partially decompose when exposed to moisture and their decomposition releases chemical species that migrate either toward the sensor or away from the sensor, these species being highly corrosive. Notably, cesium iodide and lanthanum oxysulfide have this drawback.

As regards cesium iodide, its decomposition gives cesium hydroxide $Cs^+OH^-$ and free iodine $I_2$, which can then combine with iodide ions to give the complex $I_3^-$.

As regards lanthanum oxysulfide, its decomposition gives hydrogen sulfide $H_2S$, which is chemically very aggressive.

Moisture is extremely difficult to eliminate. The ambient air, in which the sealing operation is carried out, always contains moisture.

One of the important aspects when producing these detectors is to minimize the amount of moisture initially present within the detector, and in contact with the scintillator, and to prevent said moisture from diffusing into the sensor during its operation.

In a first configuration, called an "added-scintillator" configuration, the scintillating substance is deposited on a support through which the radiation to be detected has to pass before reaching the sensor. The assembly is then bonded to the sensor.

In a second configuration, called a "direct-deposition" configuration, the sensor serves as support for the scintillating substance, which is therefore in direct and intimate contact with the sensor. The scintillating substance is then covered with a protective coating. The two configurations each have advantages and disadvantages.

One advantage of the first, attached-scintillator, configuration is that the sensor and the scintillator are joined together only if they have been successfully tested, thereby improving the overall fabrication yield.

Other advantages of this configuration will be apparent on reading French patent application FR 2 831 671.

The aim of the invention is to improve the production of a large detector requiring the attachment of several smaller photosensitive sensors, the radiation detector being fabricated in the first configuration.

FIGS. 1a to 1d describe an operating method for producing attached assemblies.

Small sensors 1 are aligned and positioned individually. A seal 2 is positioned between the sensors 1 and then a liquid adhesive 3 is spread over the sensors 1. The seal 2 prevents the adhesive 3 from flowing between the sensors 1. A substrate 4 common to the various sensors 1 is then bonded to the sensors 1 by means of the adhesive 3. The material of the seal 2 must have a high viscosity so as to prevent it from flowing between the sensors 1. However, this viscosity must be low enough for it to perfectly match a portion of the space that the adhesive 2 must fill between the sensors 1.

As for the material of the adhesive 3, this must have a viscosity low enough to migrate over all the surfaces of the sensors 1 in order to be bonded to the entire surface. However, too fluid an adhesive 3 would have a tendency to extend beyond the periphery of the sensors 1.

With this operating method, it is impossible to develop a single adhesive acting both as adhesive 2 and as adhesive 3. Such a single adhesive would have to reconcile the contradiction of being both fluid enough to migrate over all the surfaces of the sensors 1, and achieve complete bonding, and viscous enough to prevent it from flowing between the sensors 1.

In a radiation detector embodiment, the following operation consists in depositing, on the attached assembly thus fabricated, a layer of liquid adhesive 5 intended to bond a scintillator 6 to the attached assembly. The adhesive 5 is a material that has to be optically transparent so as not to absorb the light emitted by the X-ray-illuminated scintillator 6. The material of the adhesive 5 must have a viscosity low enough for it to penetrate between the sensors 1 and to completely fill the residual space between the sensors 1 left free by the adhesive 2 deposited during the preceding operation. It must also have a viscosity high enough for it not to flow excessively over the periphery of the sensors 1.

The adhesive 5 must be thin enough to allow good image quality. This is because the light generated by the scintillator 6 must pass through this adhesive layer before being absorbed by the sensors 1. This light will be scattered less the thinner the adhesive 5.

For example, liquid adhesives 5 have been used from the families of silicone, epoxy and acrylic adhesives, or any other family of adhesives. These liquid adhesives must be deposited beforehand on one of the two surfaces to be bonded, or on both of them. This adhesive dispensing must be very uniform in terms of thickness and this thickness must be perfectly controlled so as to achieve image quality, and notably resolution, which is uniform at all points on this image.

FIGS. 2a to 2d describe four types of defects encountered when producing the detectors. These fabrication defects result in defects in the image produced by the detector when irradiated with X-rays.

In FIG. 2a, the first defect is characteristic of too low a viscosity of the adhesive 2, which completely interfered in the space available between the sensors 1 and comes into direct contact with the scintillator 6 when the latter is bonded by means of the adhesive 5. This first fabrication defect results in a defect in the image obtained by the detector. The amount of light reaching the sensors 1 will be too great at the junction between the sensors 1, the sensitivity of the detector in these places being too high.

In FIG. 2b, the second defect is characteristic either of too high a viscosity of the adhesive 2 or of too high a viscosity of the adhesive 5. These two adhesives cannot come into contact with each other, so that an air-filled cavity persists between the sensors 1. This may result in a break in the optical continuity of the light paths at the interfaces when the light coming from the scintillator 6 passes through them. As a result, there is a loss of light, and too dark an image at the location of these air-filled cavities.

This type of defect may evolve and create the third defect, shown in FIG. 2c, in which the volume of trapped air may expand and create delaminations at the bonded interfaces.

The fourth defect shown in FIG. 2d may be observed when the sensors 1 have not been correctly aligned in the horizontal plane—there is thus a height discrepancy. A mechanical step when passing from one sensor 1 to its neighbor may result in a break in continuity of the adhesive 5. This type of defect could be resolved by an adhesive 5 having a viscosity low enough to follow the break of the mechanical step. However, too low a viscosity of the adhesive 5 may result in poor lifetime of the optical contact at the step break.

Thus, the four fabrication defects described above always result in breaks in the continuity of the adhesive 5 and absences of material or the presence of air cavities that will result in faults in optically coupling the scintillator 6. At the place of these faults, the image may be exaggeratedly bright (first defect) or exaggeratedly dark (second, third and fourth defects).

Resolution of these defects is faced with having to have the viscosity of the adhesives 2, 3 and 5 which require contradictory properties. It is in fact required of the adhesives 2, 3 and 5 to have sufficiently low viscosities or sufficiently high viscosities for fulfilling contradictory functions.

SUMMARY OF THE INVENTION

The aim of the invention is to alleviate all or some of the problems mentioned above by providing a method of fabricating a radiation detector comprising several attached sensors without a specific seal between the sensors.

For this purpose, the subject of the invention is a method of fabricating a radiation detector comprising a photosensitive sensor assembly, a scintillator that converts the radiation into radiation to which the photosensitive sensor assembly is sensitive, the scintillator being fastened by adhesive bonding to the sensor assembly, the sensor assembly comprising a substrate and several attached sensors, the sensors each having two opposed faces, a first face of which is bonded to the substrate and a second face of which is bonded to the scintillator, characterized in that the following operations are linked:

the sensors are deposited via their second face on an adhesive film; and the sensors are bonded via their first face to the substrate.

BRIEF DESCRIPTION OF THE DRAWING

The invention will be better understood and other advantages will become apparent on reading the detailed description of embodiments given by way of example, the description being illustrated by the appended drawing in which:

For the sake of clarity, identical elements will bear identical references in the various figures.

FIGS. 1a to 1d and FIGS. 2a to 2d have already been described above.

DETAILED DESCRIPTION OF THE PREFERRED EMBODIMENT

Figure 1A:
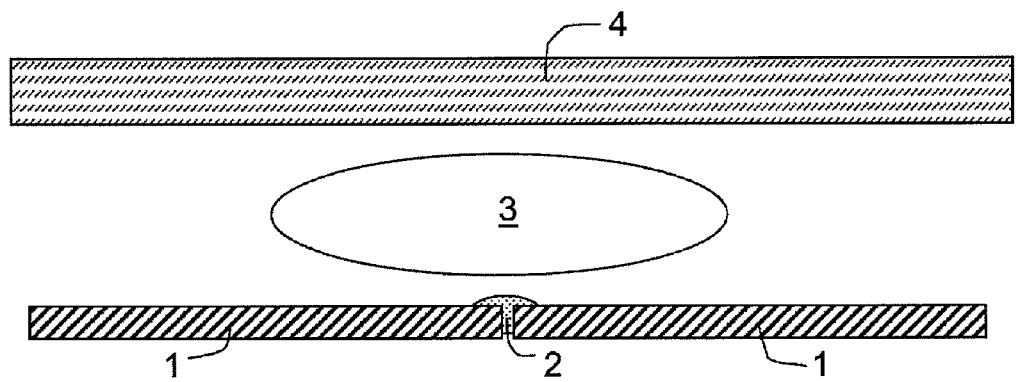
FIGS. 1a to 1d show a known method of fabricating a radiation detector.
Figure 1B:
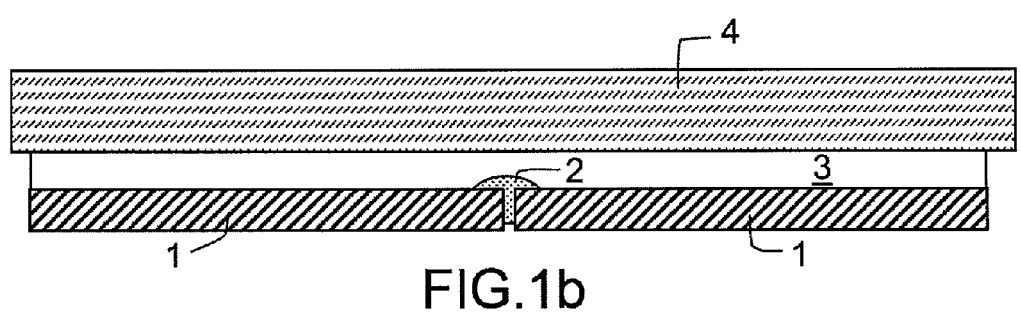
Figure 1C:
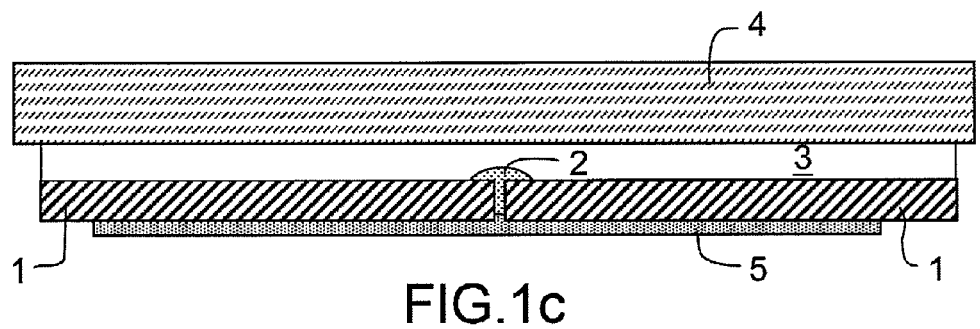
Figure 1D:
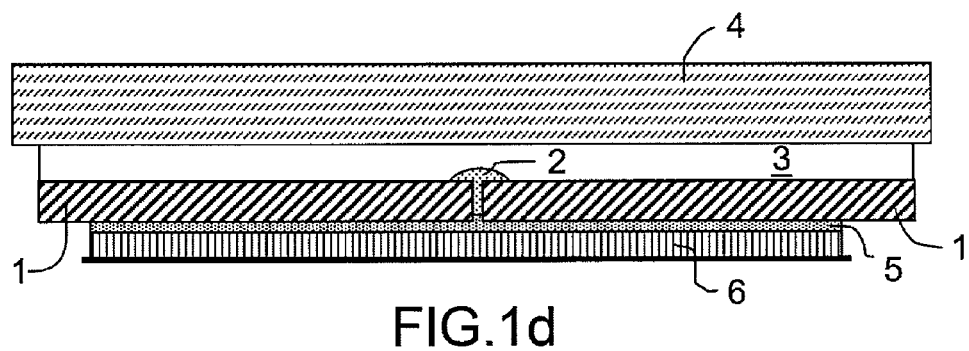
Figure 2A:
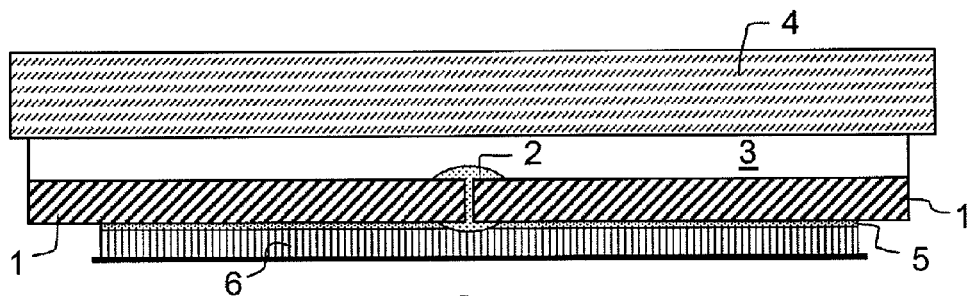
FIGS. 2a to 2d show various defects due to the method described using FIGS. 1a to 1d.
Figure 2B:
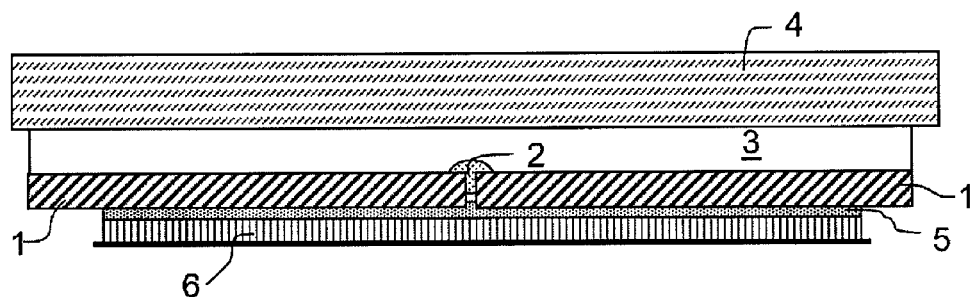
Figure 2C:
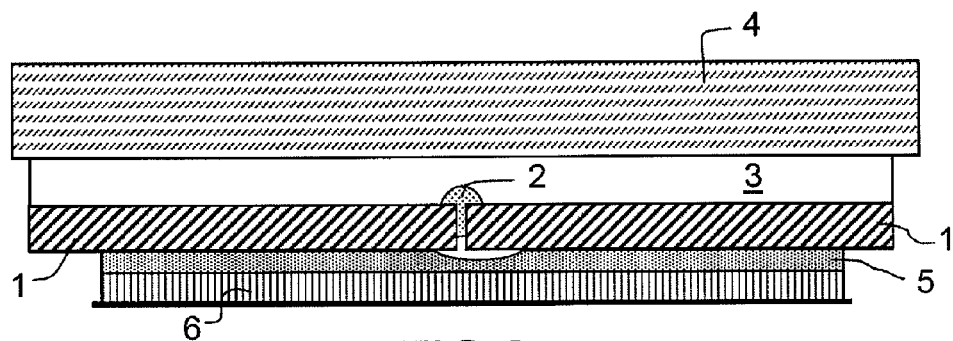
Figure 2D:
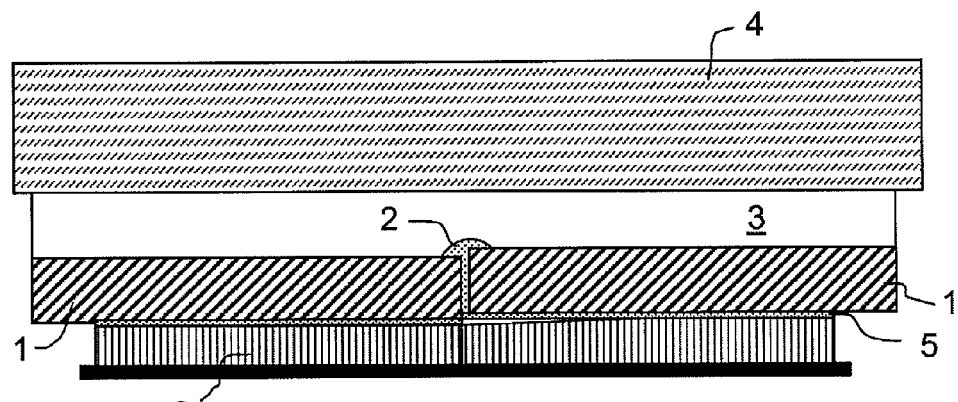
Figure 3A:
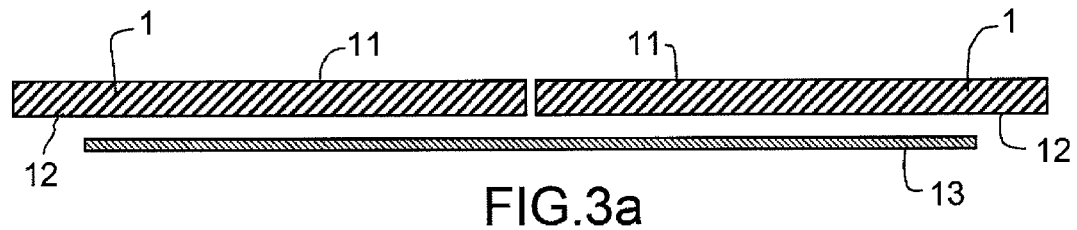
FIGS. 3a to 3d show a first alternative way of implementing the method of the invention.

FIG. 3a shows a first step in fabricating a radiation detector comprising several photosensitive sensors 1 advantageously comprising a matrix of photodiodes or phototransistors of the TFT type that are fabricated on an amorphous silicon wafer. FIG. 3a shows only two sensors 1, but of course the invention may be implemented for a larger number of attached sensors 1. The sensors 1 both have two opposed faces 11 and 12. A first step of a method according to the invention consists in depositing the sensors 1 via their face 12 on an adhesive film 13. The adhesive film 13 is used as reference plane when depositing and bonding the sensors 1 thereto. This makes it possible to improve the alignment of the faces 12 of the various sensors 1.

Figure 3B:
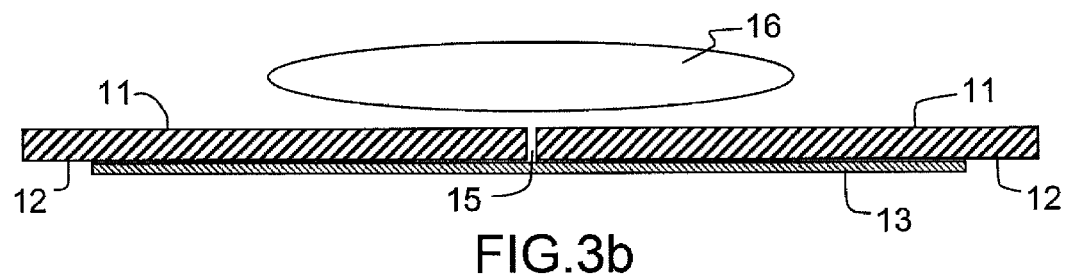
Figure 3C:
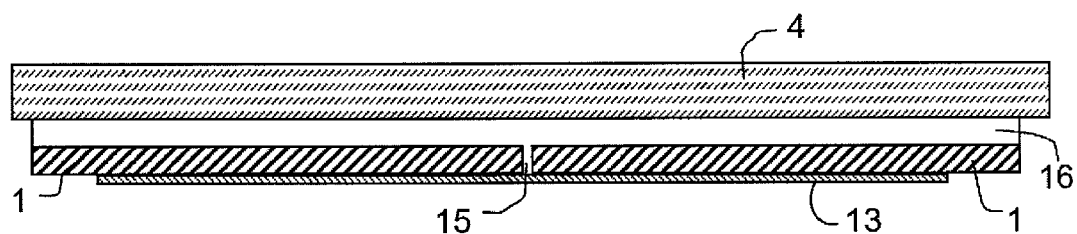

A second step of the method consists in bonding the sensors 1 via their face 11 to a substrate 4. This step is illustrated with the aid of FIGS. 3b and 3c. In a first phase of this second step, a liquid adhesive 16 is deposited on the face 11 of the sensors 1 and in interstices 15 separating the sensors 1. A low-viscosity adhesive 16 is chosen so as to fill the entire space left at its disposal, notably the interstices 15. In a second phase, the sensors 1 and the substrate 4 are bonded by means of the liquid adhesive 16. The film 13 prevents the liquid adhesive 16 from flowing via the interstices 15. The use of the adhesive film 13 as reference plane also allows the space between the sensors 1 and the substrate 4 to be properly filled with the adhesive 16. Notably, the adhesive film 13 ensures that the interstices 15 are properly sealed in order for the liquid adhesive 16 to be contained therein and in particular for the liquid adhesive 16 to be prevented from being able to slip between the adhesive film 13 and the sensors 1 on the face 11. There is no longer a requirement to use a seal 2, as described in FIGS. 1a to 1d.

This space has to be properly filled so as to obtain spatially continuous and homogeneous optical bonding between sensors 1 and substrate 4. This filling is necessary for correct operation of detectors, which require spatially continuous and homogeneous illumination through the substrate 4 (the illumination not being shown).

Figure 3D:
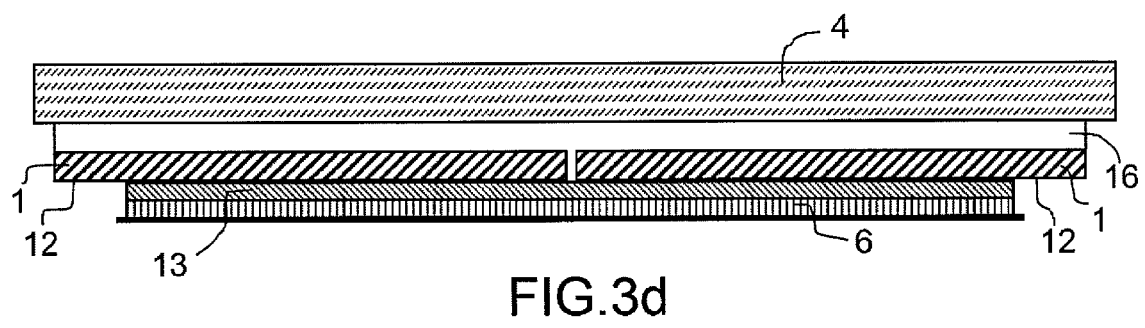

A third step of the method, illustrated in FIG. 3d, consists in bonding a scintillator 6 to the face 12 of the sensors 1 by means of the adhesive film 13.

In the first step of the method, the sensors 1 are aligned and deposited on the adhesive film 13 under a vacuum or by lamination, so as to prevent air bubbles from being trapped between the adhesive film 13 and the sensors 1. The adhesive film 13 by its continuous nature and its constant thickness provides a perfectly planar surface after the assembly has been attached and will present this defect-free planar surface for optically bonding the scintillator 6.

The fact of carrying out the first step before the second ensures that there is good flatness between the faces 12 of the various sensors 1.

Figure 4A:
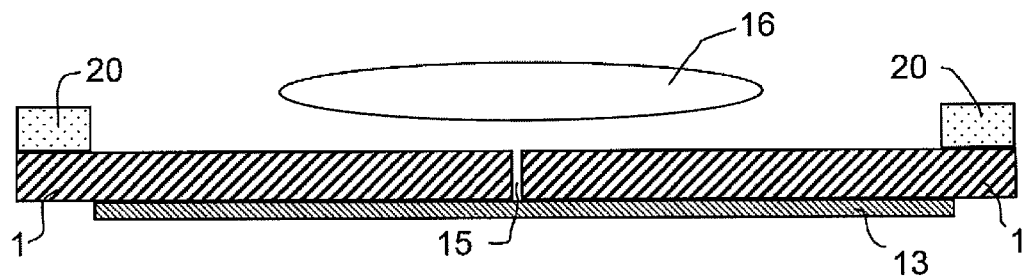
FIGS. 4a to 4c show a second alternative way of implementing the method of the invention.
Figure 4B:
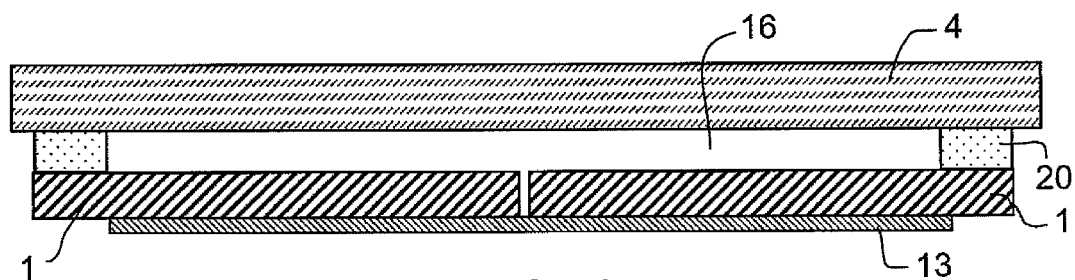
Figure 4C:
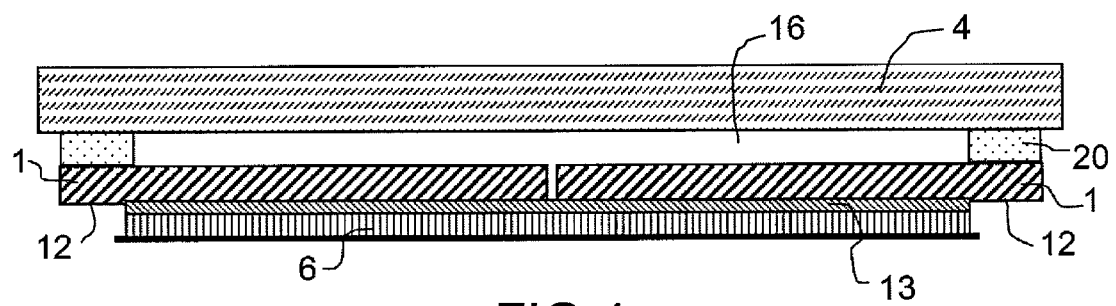

A variant of the second step, illustrated in FIGS. 4a to 4c, consists in placing, on the periphery of the sensors 1, a ring 20 for retaining the liquid adhesive 16. Thanks to this ring 20, it is possible to use an adhesive 16 of very low viscosity so as to ensure that the interstices 15 are properly filled, while preventing any overflow of the adhesive 16 beyond the periphery of the sensors 1. Apart from retaining the adhesive 16 on the periphery of the sensors 1, the ring 20 may also strengthen an assembly formed by the sensors 1 and the adhesive film 13.

FIG. 4a illustrates the first phase of the second step, during which the liquid adhesive 16 is deposited. FIG. 4b illustrates the second phase during which the sensors 1 and the substrate 4 are bonded. FIG. 4c illustrates the third step of the method during which the scintillator 6 is bonded to the face 12 of the sensors 1 by means of the adhesive film 13.

Figure 5A:
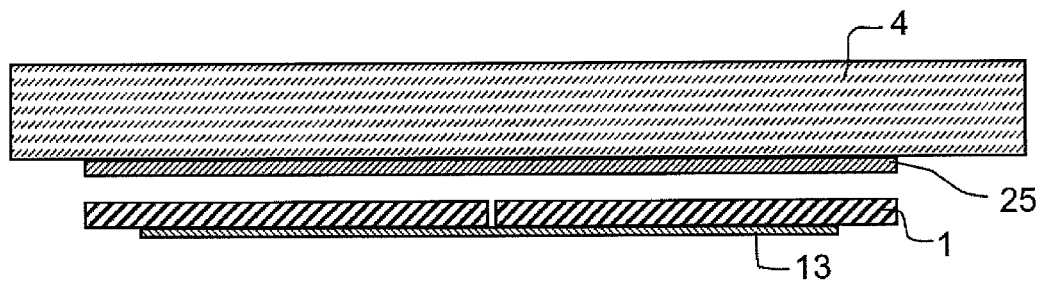
FIGS. 5a to 5c show a third alternative way of implementing the method of the invention.
Figure 5B:
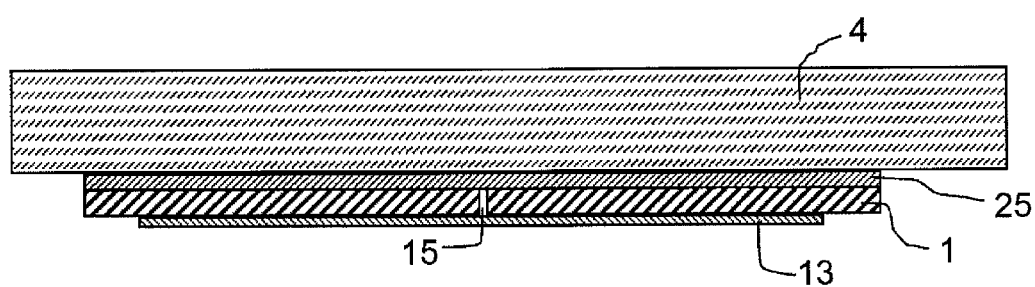
Figure 5C:
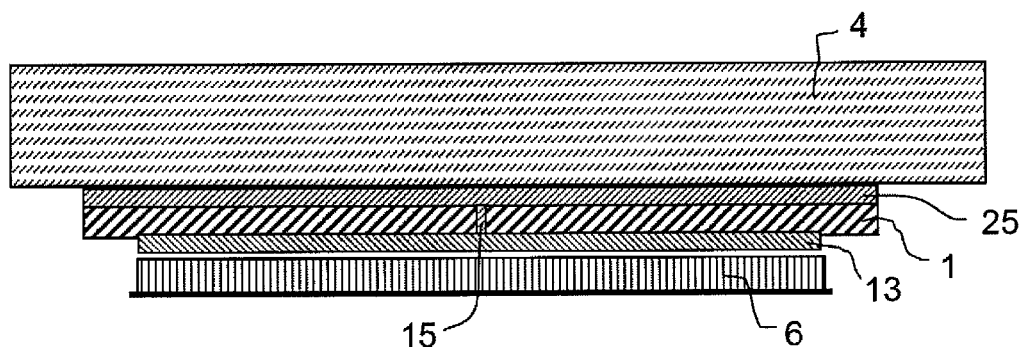

FIGS. 5a to 5c illustrate a variant of the method of the invention in which the liquid adhesive 16 is replaced with a second adhesive film 25 for bonding the sensors 1 to the substrate 4. In FIG. 5a, the adhesive film 25 is deposited on the substrate 4. In FIG. 5b, the assembly formed by the sensors 1 and the film 13 is bonded to the substrate 4. In FIG. 5c, the scintillator 6 is bonded to the face 12 of the sensors 1 by means of the adhesive film 13.

In this embodiment, it is possible for the interstices 15 to be filled by means of a liquid adhesive having a very low viscosity in order to ensure good optical continuity between the scintillator 6 and the various sensors 1.

FIGS. 6a to 6d illustrate another variant of the method of the invention in which the bonding of the scintillator 6 to the second face 12 of the sensors 1 by means of the adhesive film 13 takes place before the bonding of the sensors 1 to the substrate 4.

Figure 6A:
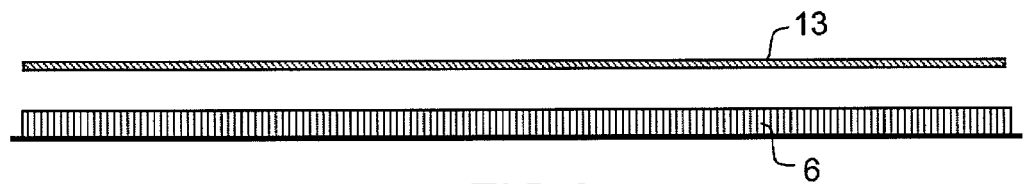
FIGS. 6a to 6d show a fourth alternative way of implementing the method of the invention.
Figure 6B:
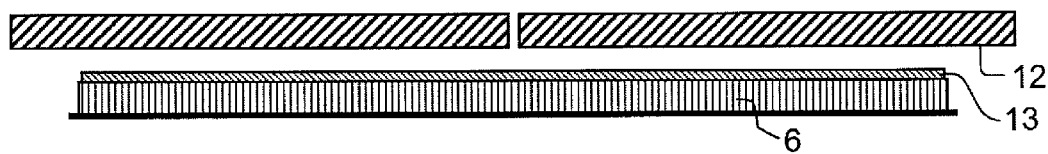
Figure 6C:
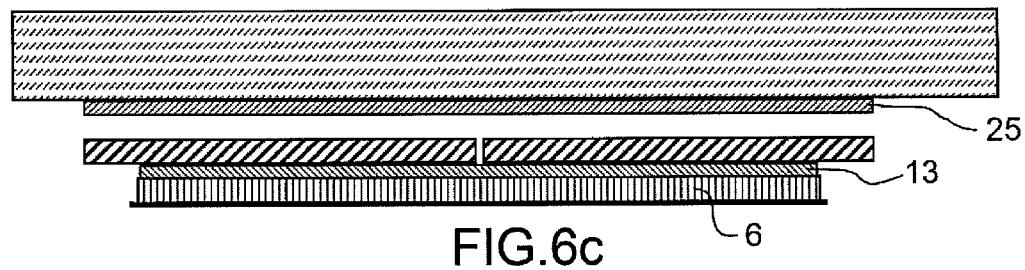
Figure 6D:
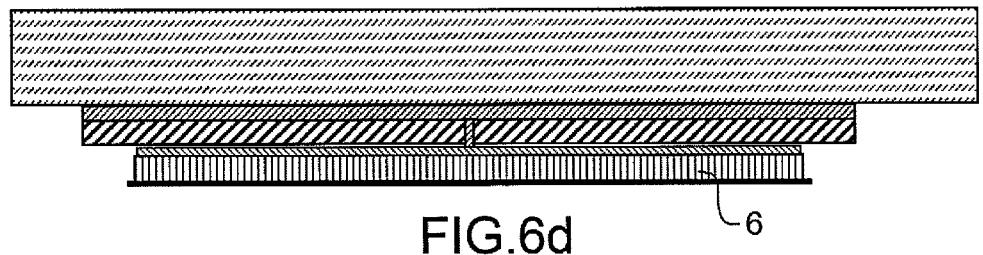

In FIG. 6a, the adhesive film 13 is deposited on the scintillator 6. In FIG. 6b, the sensors 1 are bonded to the scintillator 6 by means of the film 13. In FIG. 6c, the assembly formed by the sensors 1 and the scintillator 6 is bonded to the substrate 4 by means of the adhesive film 25. In FIG. 6d, the interstices 15 are filled by means of a liquid adhesive having a very low viscosity.

Of course, it is possible to replace the bonding of the sensors 1 using the film 25 by bonding using the adhesive 16, as described in FIGS. 3 and 4.

The adhesive films 13 and 25 may be raw transparent adhesives available between two protective peel-off membranes. They may be transparent films coated on both their sides with adhesive layers, which are themselves also protected by protective membranes. They may also be hot-melt films, the adhesion of which is developed by a heat treatment, as will be described below.

Advantageously, the adhesive films 13 and 25 are not adherent at room temperature. This makes it easier to position the scintillator 6 and the substrate 4 relative to the sensors 1 before the actual bonding with the adhesive films 13 and 25 is carried out. The absence of room-temperature adhesion has another advantage in the case of a scintillator comprising gadolinium oxysulfide. This is because the needle structure of scintillators based on cesium iodide allows air trapped between the sensors 1 and the scintillator 6 to be removed when they are brought together. However, scintillators based on gadolinium oxysulfide use a binder of the plastic type that gives them a smooth surface that prevents the air trapped between the sensors 1 and the scintillator 6 from being removed, as in the case of a needle structure. Consequently, the absence of adhesion enables the air trapped between the sensors 1 and the scintillator 6 to be removed when the scintillator 6 is being positioned relative to the sensors 1 before the actual bonding using the adhesive film 13 is carried out.

Advantageously, the adhesive film 13 is a hot-melt film. In other words, the bonding by means of the adhesive film 13 is carried out by raising the temperature of the assembly formed by the sensor 1, the adhesive film 13 and the scintillator 5 once they have been positioned relative to one another.

Advantageously, the adhesive film 13 comprises polyethylene or polypropylene or polyurethane or polyamide or polyvinyl butyral or ethylene/vinyl acetate.

Advantageously, the adhesive film 13 has a thickness between 20 and 40 µm. This thickness is less than that which is possible to achieve with means for using a known optical cement available in liquid or gel form. For example screen printing is used to deposit the cement as uniformly as possible. This means of implementation does not make it possible in practice to obtain a uniform layer of adhesive with a thickness of less than 40 µm, which thickness makes it possible for the scintillator optical coupling function to be achieved. In contrast, it is possible to obtain adhesive films of perfectly controlled thickness equal to 25 µm by lamination.

It will be readily seen by one of ordinary skill in the art that embodiments according to the present invention fulfill many of the advantages set forth above. After reading the foregoing specification, one of ordinary skill will be able to affect various changes, substitutions of equivalents and various other aspects of the invention as broadly disclosed herein. It is therefore intended that the protection granted hereon be limited only by the definition contained in the appended claims and equivalents thereof.

The invention claimed is:

1. A method of fabricating a radiation detector comprising a photosensitive sensor assembly, a scintillator that converts the radiation into radiation to which the photosensitive sensor assembly is sensitive, the scintillator being fastened by adhesive bonding to the sensor assembly, the sensor assembly comprising a substrate and several attached sensors, the sensors each having two opposed faces, a first face of which is bonded to the substrate and a second face of which is bonded to the scintillator, wherein the following operations are linked in this order:

the sensors are deposited via their second face on an adhesive film;

the sensors are bonded via their first face to the substrate; and the scintillator is bonded by means of the adhesive film.

2. The method as claimed in claim 1, wherein the adhesive film is used as a reference plane when depositing the sensors on the adhesive film and bonding them thereto.

3. The method as claimed in claim 1, wherein the operation of bonding the sensors to the substrate comprises the following operations:

a liquid adhesive is deposited on the first face of the sensors and in interstices separating the sensors; and the sensors and the substrate are bonded by means of the liquid adhesive.

4. The method as claimed in claim 3, wherein, before the liquid adhesive is deposited, a ring for retaining the liquid adhesive is placed on the periphery of the sensors.

5. The method as claimed in claim 1, wherein the operation of bonding the sensors to the substrate comprises the following operations:

a second adhesive film is deposited on the first face of the sensors; and the sensors and the substrate are bonded by means of the second adhesive film.

6. The method as claimed in claim 5, wherein the interstices separating the sensors are filled by means of a liquid adhesive.

7. The method as claimed in claim 1, wherein the scintillator is bonded to the second face of the sensors by means of the adhesive film and in that the bonding of the scintillator takes place before the bonding of the sensors to the substrate.

8. The method as claimed in claim 1, wherein the photosensitive sensors comprise a matrix of photodiodes or phototransistors of the TFT type that are fabricated on an amorphous silicon wafer.

9. The method as claimed in claim 1, wherein the sensors are fabricated in CMOS technology.

10. The method as claimed in claim 1, wherein the scintillator is based on gadolinium oxysulfide.

11. The method as claimed in claim 1, wherein the scintillator is based on cesium iodide.

12. The method as claimed in claim 1, wherein the adhesive film comprises a material from the group comprising polyethylene, polypropylene, polyurethane, polyamide, polyvinyl butyral and ethylene/vinyl acetate.

\* \* \* \* \*